United States Patent
Jiang et al.

(10) Patent No.: US 11,177,426 B2
(45) Date of Patent: Nov. 16, 2021

(54) LOW-TEMPERATURE HIGH-PERFORMANCE THERMOELECTRIC MATERIAL AND PREPARATION METHOD THEREOF

(71) Applicant: University of Electronic Science and Technology of China, Sichuan (CN)

(72) Inventors: Jing Jiang, Sichuan (CN); Yan Pan, Sichuan (CN); Yi Niu, Sichuan (CN); Ting Zhou, Sichuan (CN); Rui Zhang, Sichuan (CN); Xinrui He, Sichuan (CN); Chao Wang, Sichuan (CN)

(73) Assignee: University of Electronic Science and Technology of China, Sichuan (CN)

( * ) Notice: Subject to any disclaimer, the term of this patent is extended or adjusted under 35 U.S.C. 154(b) by 96 days.

(21) Appl. No.: 16/419,007

(22) Filed: May 22, 2019

(65) Prior Publication Data

US 2020/0220063 A1 Jul. 9, 2020

(51) Int. Cl.
*H01L 35/16* (2006.01)
*C01G 5/00* (2006.01)

(52) U.S. Cl.
CPC .............. *H01L 35/16* (2013.01); *C01G 5/006* (2013.01); *C01P 2002/72* (2013.01); *C01P 2006/32* (2013.01); *C01P 2006/40* (2013.01)

(58) Field of Classification Search
None
See application file for complete search history.

(56) References Cited

U.S. PATENT DOCUMENTS

2014/0352750 A1* 12/2014 Shin ............... C01B 19/007
136/236.1

* cited by examiner

Primary Examiner — Colin W. Slifka

(57) ABSTRACT

A low-temperature high-performance thermoelectric material possesses a chemical formula of $(Ag_yCu_{2-y})_{1-x}Te_{1-z}Se_z$, wherein $-0.025 \leq x \leq 0.075$, $0.6 \leq y \leq 1.4$, $0 < z \leq 0.25$, diffraction peaks of a main phase of the thermoelectric material are indexed as a cubic structure at room temperature of 300 K, a highest ZT value between 300 K and 673 K is in range of 0.4 to 1.6, an average ZT value $(ZT)_{avg}$ is in range of 0.2 to 1.4. The highest ZT value of this material at the room temperature is comparable to that of $Bi_2Te_3$, which is an excellent complement to existing low-temperature thermoelectric materials. At the same time, the present invention also indicates a new strategy to improve the low-temperature thermoelectric performance of $Cu_2X$-based (here, X is S, Se, Te) materials, and lays a foundation for the application of $Cu_2X$-based materials in the field of low-temperature thermoelectricity.

3 Claims, 3 Drawing Sheets

LOW-TEMPERATURE HIGH-PERFORMANCE THERMOELECTRIC MATERIAL AND PREPARATION METHOD THEREOF

CROSS REFERENCE OF RELATED APPLICATION

The present invention claims priority under 35 U.S.C. 119(a-d) to CN 201910006953.1, filed Jan. 4, 2019.

BACKGROUND OF THE PRESENT INVENTION

Field of Invention

The present invention relates to the field of thermoelectric materials, and more particularly to a low-temperature high-performance thermoelectric material and a preparation method thereof.

Description of Related Arts

With the rapid consumption of non-renewable energy and the serious impact of pollutants from non-renewable energy on the environment, it is urgent to develop a new clean energy technology. In addition to clean energy such as wind energy, tidal energy and solar energy, natural energy and human activities also contain enormous energy that has not been exploited, such as geothermal energy and various waste heat energy emitted from modern industrial production and life. Utilizing the Seebeck effect of thermoelectric materials, thermoelectric devices can directly convert thermal energy into electrical energy, which is very suitable for geothermal and waste heat power generation, not only greatly improves energy efficiency, but also greatly reduces carbon dioxide emissions. Therefore, the thermoelectric material is a clean, environmentally friendly and non-polluting new energy technology. In addition, the thermoelectric material also has a Peltier effect and can be used for refrigeration. It has small volume, simple structure, no mechanical moving parts, high reliability, and is not prone to failure. The application of the thermoelectric material in military, aerospace, electronic information and other fields also shows a booming trend, including local cooling of precision electronic instruments such as infrared detection, deep spacecraft power supplies, and electronic chips.

The thermo-electric conversion efficiency of thermoelectric devices is closely related to the performance of thermoelectric materials, while the properties of thermoelectric materials are usually characterized by the dimensionless thermoelectric merit ZT: $ZT=\sigma S^2 T/\kappa$, where $\sigma$, $S$, $\kappa$ and $T$ are respectively the electrical conductivity, Seebeck coefficient, thermal conductivity and absolute temperature of the thermoelectric materials. High thermoelectric conversion efficiency requires the thermoelectric materials with high ZT values. At present, a variety of thermoelectric materials with higher ZT values have been reported, including SnSe (ZT~2.6@923 K), $AgPb_mSbTe_{m+2}$ (ZT~2.2@800 K), and Skutterudite (such as $Yb_{0.2}Co_4Sb_{12}$, ZT~1.2@600-900 K), Zintl (such as $Yb_{14}MnSb_{11}$, ZT~1@1200 K), Clathrate (such as $Ba_8Ga_{16}Ge_{30}$, ZT~1.35@900 K), Half-Heusler (such as $(Zr_{0.5}Hf_{0.5})_{0.5}Ti_{0.5}NiSn_{0.998}Sb_{0.002}$, ZT~1.5@700 K), chalcogenide (such as $Cu_2S_{0.52}Te_{0.48}$, ZT~2.1@1000 K). These materials have high ZT values at high temperatures (>700 K) and are good high-temperature thermoelectric materials. However, whether it is refrigeration or waste heat power generation, it depends more on the low-temperature thermoelectric properties of materials. Currently, in addition to a few materials such as $Bi_2Te_3$ and MgAgSb, other existing thermoelectric materials have low ZT values at low temperatures, especially near room temperature, and are not suitable for application at low temperatures. Therefore, it is urgent to develop a new high-performance low-temperature thermoelectric material.

SUMMARY OF THE PRESENT INVENTION

The present invention aims to provide a low-temperature high-performance thermoelectric material and a preparation method thereof. The low-temperature high-performance thermoelectric material possesses a chemical formula of $(Ag_yCu_{2-y})_{1-x}Te_{1-z}Se_z$, wherein $-0.025 \le x \le 0.075$, $0.6 \le y \le 1.4$, $0 < z \le 0.25$, diffraction peaks of a main phase of the thermoelectric material are indexed as a cubic structure at room temperature of 300 K, a highest ZT value between 300 K and 673 K is in range of 0.4 to 1.6, an average ZT value $(ZT)_{avg}$ is in range of 0.2 to 1.4.

A low-temperature high-performance thermoelectric material possesses a chemical formula of $(Ag_yCu_{2-y})_{1-x}Te_{1-z}Se_z$, wherein $-0.025 \le x \le 0.075$, $0.6 \le y \le 1.4$, $0 < z \le 0.25$.

A technical solution of a low-temperature high-performance thermoelectric material provided by the present invention is as follows.

The conventional copper chalcogenide $Cu_2X$ (X is S, Se, or Te) thermoelectric material has excellent thermoelectric properties at high temperatures because the high-temperature phase is a superionic cubic phase and has characteristics of "phononic liquid, electronic crystal". When the temperature is lowered, $Cu_2X$ will undergo one or several phase transitions from a high-temperature cubic phase to a low-temperature non-cubic phase, in which the thermoelectric performance is much lower. Therefore, if the high-temperature cubic phase of $Cu_2X$ can be stabilized at room temperature, its low-temperature thermoelectric performance will be significantly improved. The present invention deeply studies the phase transition property of the $Cu_2X$-based material, and stabilizes the face-centered cubic phase of the $Cu_2X$-based material at room temperature through Se doping and Ag/Cu alloying, and obtains a $(Ag_yCu_{2-y})_{1-x}Te_{1-z}Se_z$ material with excellent low-temperature thermoelectric performance.

A low-temperature high-performance thermoelectric material possesses a chemical formula of $(Ag_yCu_{2-y})_{1-x}Te_{1-z}Se_z$, wherein $-0.025 \le x \le 0.075$, $0.6 \le y \le 1.4$, $0 < z \le 0.25$.

Preferably, $x=-0.025$, 0, 0.005, 0.01, or 0.075; $y=0.6$, 0.8, 0.9, 1, 1.2, or 1.4; $z=0.05$, 0.1, 0.12, 0.2, or 0.25.

Preferably, $(x, y, z)=(0, 1, 0.1)$ or $(0.005, 1, 0.1)$.

A preparation method of a low-temperature high-performance thermoelectric material comprises steps of:

(S1) charging, which comprises: respectively weighing silver (Ag), copper (Cu), tellurium (Te), and selenium (Se) according to a stoichiometric ratio of $(Ag_yCu_{2-y})_{1-x}Te_{1-z}Se_z$, wherein $-0.025 \le x \le 0.075$, $0.6 \le y \le 1.4$, $0 < z \le 0.25$, and then loading the Ag, Cu, Te and Se with ball-grinding balls into a ball-grinding tank, and then sealing in an argon atmosphere inside a glove box;

(S2) ball-grinding, which comprises: loading the ball-grinding tank into a high-energy ball mill machine, mechanically alloying for 10-20 h, and obtaining $(Ag_yCu_{2-y})_{1-x}Te_{1-z}Se_z$ powders; and (S3) sintering the powders obtained by the step of (S2) at a temperature in a range of 200° C. to 500° C. for 3-10 min, and obtaining a $(Ag_yCu_{2-y})_{1-x}Te_{1-z}Se_z$ bulk thermoelectric material.

Further, in the step of (S1), x=−0.025, 0, 0.005, 0.01, or 0.075, y=0.6, 0.8, 0.9, 1, 1.2, or 1.4, z=0.05, 0.1, 0.12, 0.2, or 0.25.

Further, in the step of (S2), ball-grinding is performed for 15 h.

Further, in the step of (S3), hot press sintering or spark plasma sintering is performed with a graphite die at 218° C. for 5 min.

Beneficial effects of the present invention are as follows.

The present invention provides a low-temperature high-performance thermoelectric material, which displays very promising thermoelectric properties in a wide temperature range from room temperature to 673 K. The highest ZT value of this material at the room temperature is comparable to that of $Bi_2Te_3$, which is an excellent complement to existing low-temperature thermoelectric materials. At the same time, the present invention also indicates a new strategy to improve the low-temperature thermoelectric performance of $Cu_2X$-based (X is S, Se, or Te) materials, and lays a foundation for the application of $Cu_2X$-based materials in the field of low-temperature thermoelectricity, and opening up a new road for promoting low-cost refrigeration and waste heat power generation.

These and other objectives, features, and advantages of the present invention will become apparent from the following detailed description, the accompanying drawings, and the appended claims.

Figure 1:
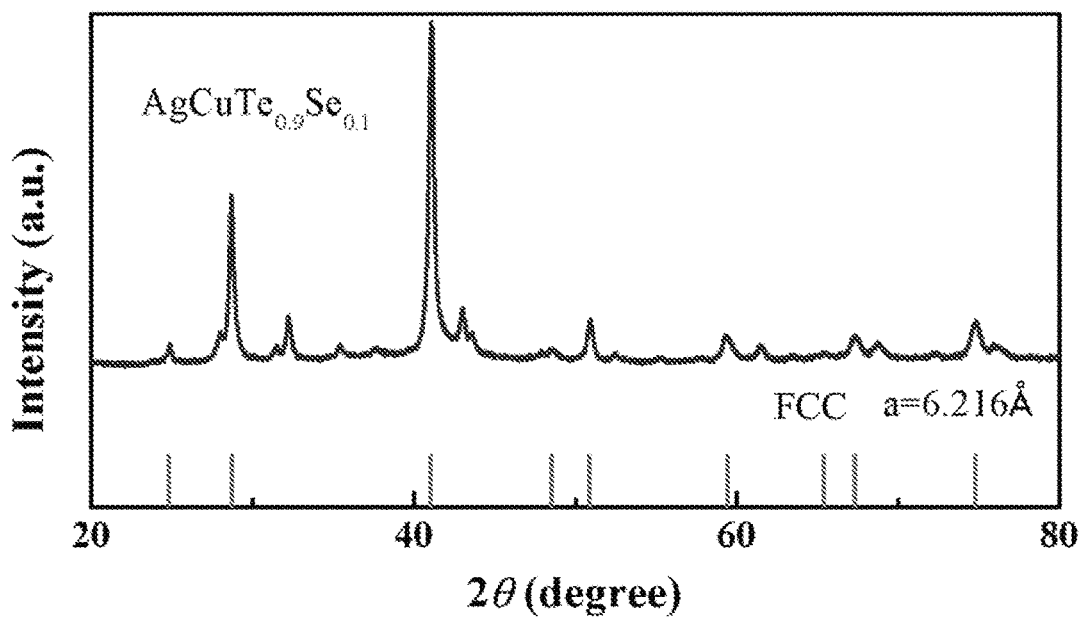
FIG. 1 is a room-temperature XRD (X-ray diffraction) pattern of a $AgCuTe_{0.9}Se_{0.1}$ thermoelectric material according to a first embodiment of the present invention, wherein diffraction peaks of a main phase are indexed as a face-centered cubic (FCC) structure with a lattice constant of 6.216 Å.
Figure 2:
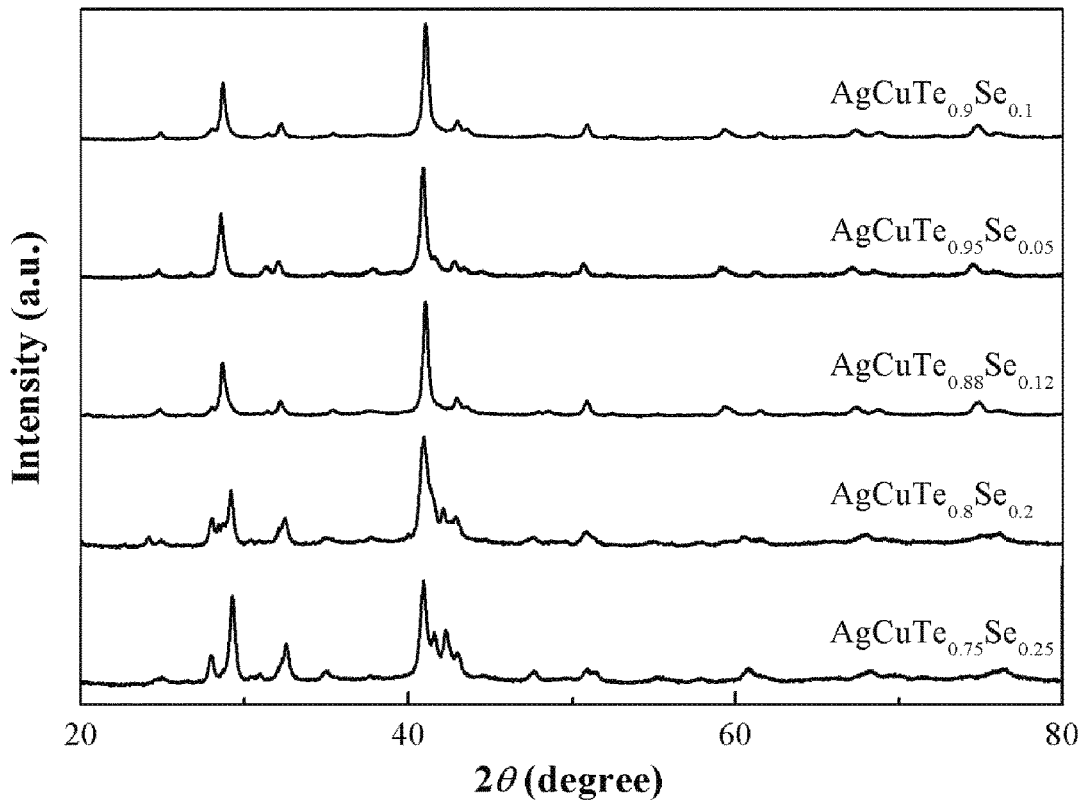
FIG. 2 is a room-temperature XRD pattern of a $AgCuTe_{1-z}Se_z$ (here, z=0.05, 0.1, 0.12, 0.2, or 0.25) thermoelectric material according to a second embodiment of the present invention, wherein diffraction peaks of a main phase for all materials are indexed as a FCC structure.
Figure 3:
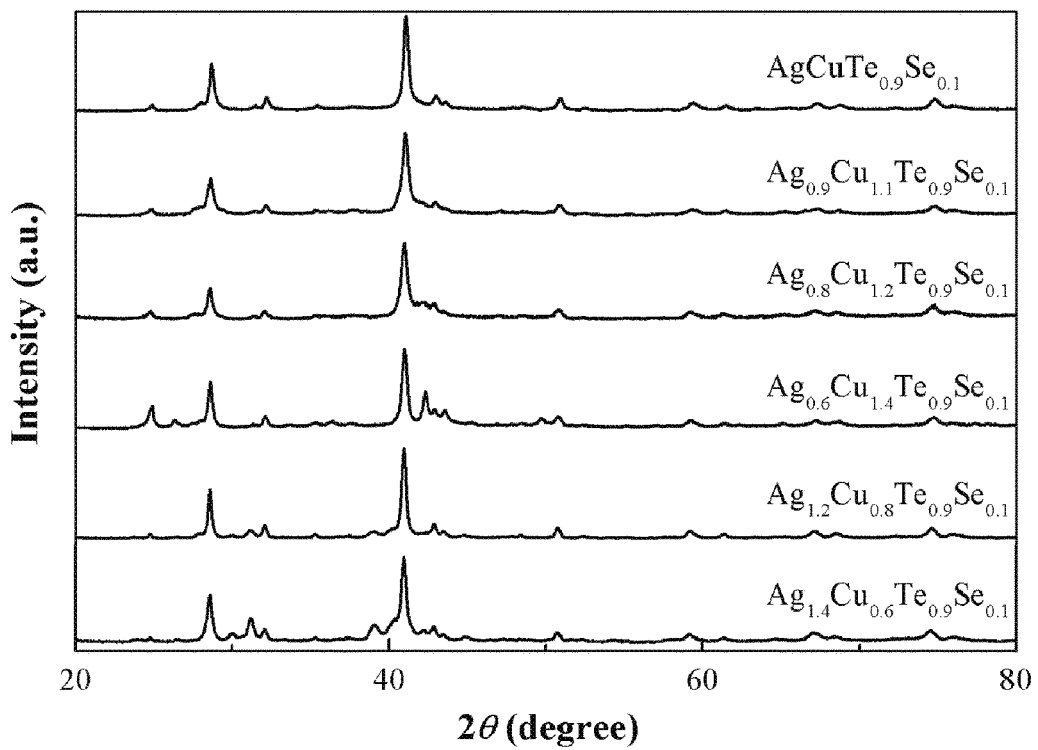
FIG. 3 is a room-temperature XRD pattern of the $Ag_yCu_{2-y}Te_{0.9}Se_{0.1}$ (here, y=0.6, 0.8, 0.9, 1, 1.2, or 1.4) thermoelectric material according to a third embodiment of the present invention, wherein diffraction peaks of a main phase for all materials are indexed as a FCC structure.
Figure 4:
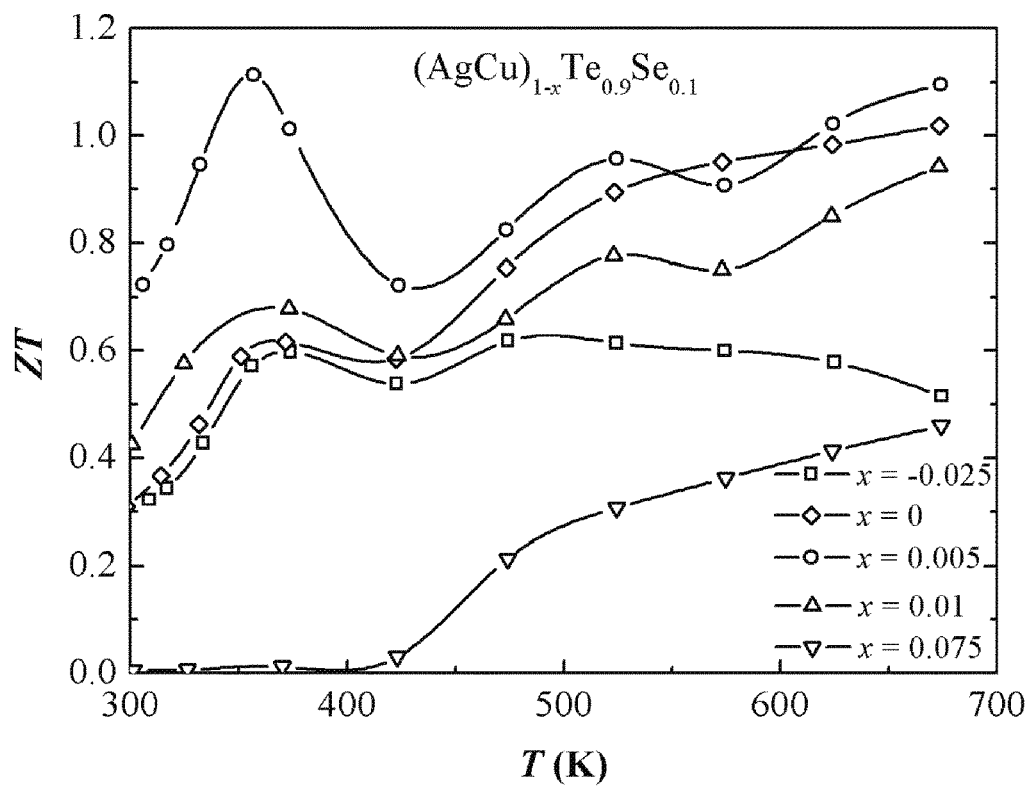
FIG. 4 demonstrates a ZT value-temperature characteristic curve of a $(AgCu)_{1-x}Te_{0.9}Se_{0.1}$ (here, x=−0.025, 0, 0.005, 0.01, or 0.075) thermoelectric material according to a fourth embodiment of the present invention.
Figure 5:
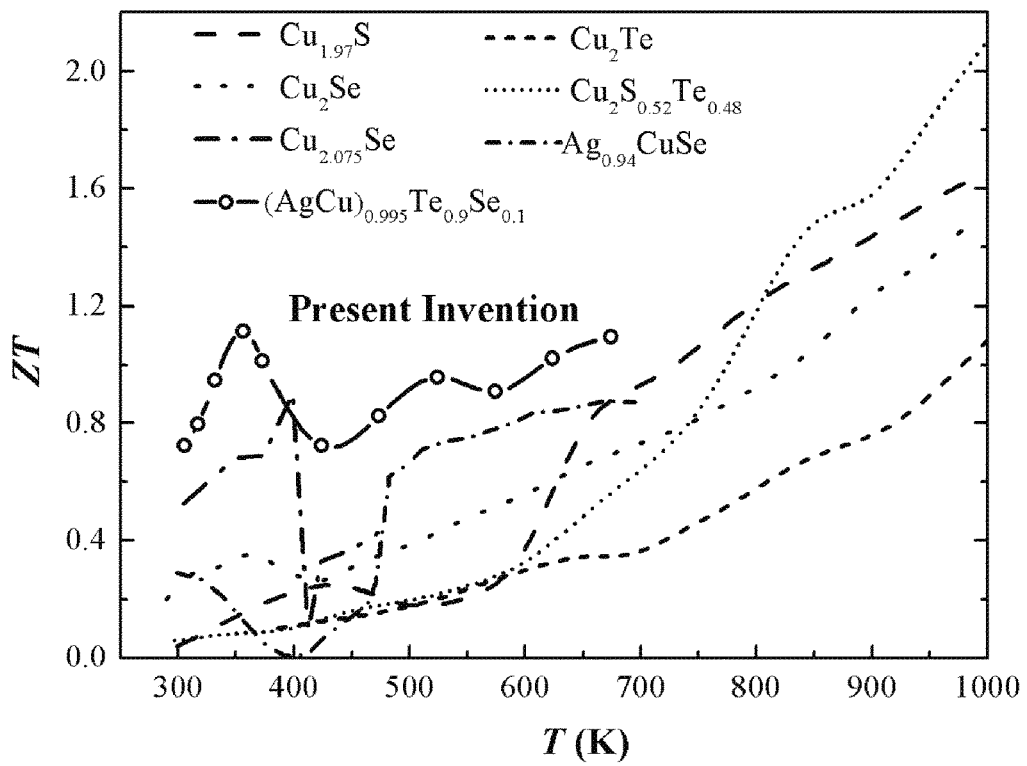
FIG. 5 demonstrates a ZT value-temperature characteristic curve of a $(AgCu)_{0.995}Te_{0.9}Se_{0.1}$ thermoelectric material according to a fifth embodiment of the present invention and other $Cu_2X$-based materials, wherein the ZT values of the $(AgCu)_{0.995}Te_{0.9}Se_{0.1}$ thermoelectric material are much higher than those of other $Cu_2X$-based materials in a temperature range from 300 K to 673 K; the ZT value-temperature characteristic curve of other $Cu_2X$-based materials derive from previously reported studies: $Cu_{1.97}S$ (Y. He et al, *Adv Mater,* 26: 3974-8, 2014), $Cu_2Se$ (H. Liu, *Nat Mater,* 11: 422-5, 2012), $Cu_{2.075}Se$ (J.-Y. Tak, *Chemistry of Materials,* 30: 3276-3284, 2018), $Cu_2Te$ (Y. He, *NPG Asia Materials,* 7: e210-e210, 2015), $Cu_2S_{0.52}Te_{0.48}$ (Y. He, *Adv Mater.* 27: 3639-44, 2015), $Ag_{0.94}CuSe$ (H. Chen, *Inorg Chem,* 54: 867-71, 2015).
Figure 6:
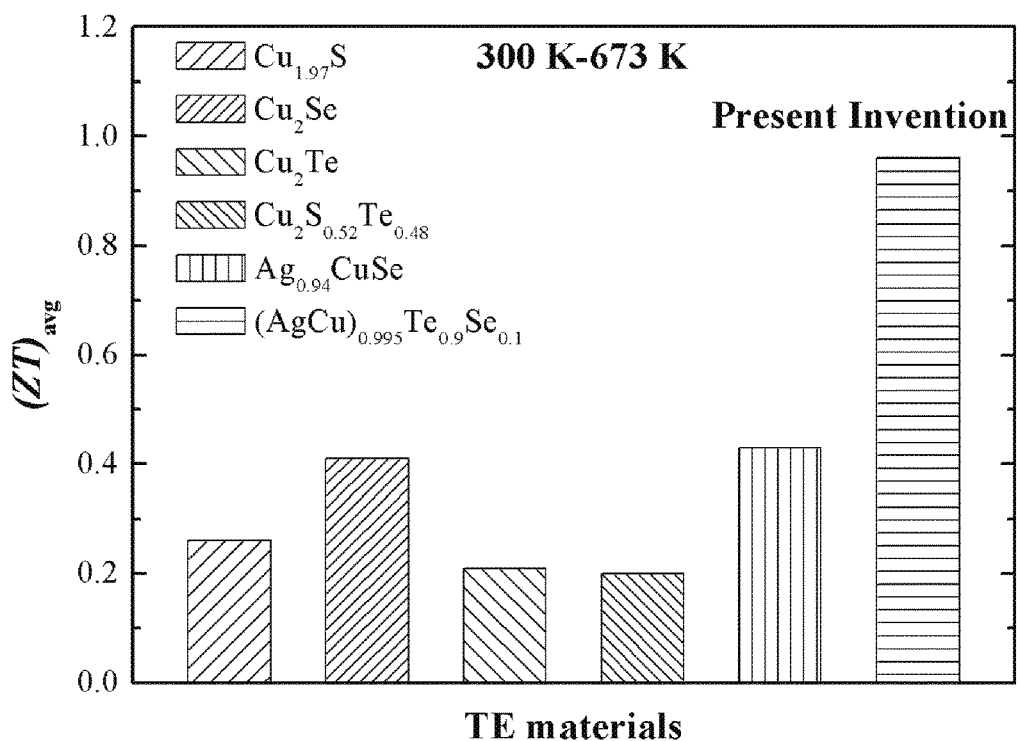
FIG. 6 demonstrates average ZT values [$(ZT)_{avg}$] between 300 K and 673 K of the $(AgCu)_{0.995}Te_{0.9}Se_{0.1}$ thermoelectric material according to the above fifth embodiment of the present invention and other $Cu_2X$-based materials, wherein the $(ZT)_{avg}$ of the $(AgCu)_{0.995}Te_{0.9}Se_{0.1}$ thermoelectric material according to the above fifth embodiment of the present invention is 2-3 times that of other $Cu_2X$-based materials, the $(Z)_{avg}$ are calculated by a formula of $(ZT)_{avg}=Z_{int}T_{ave}$, where $$Z_{int} = \frac{1}{T_h - T_c}\int_{T_c}^{T_h} Z(T)dT,$$

Z(T) refers to FIG. 5, $$T_{avg} = \frac{T_h + T_c}{2},$$

$T_c$=300 K, $T_h$=673 K.

DETAILED DESCRIPTION OF THE PREFERRED EMBODIMENT

A preparation method of a low-temperature high-performance thermoelectric material comprises steps of:

(S1) charging, which comprises: respectively weighing silver (Ag), copper (Cu), tellurium (Te), and selenium (Se) according to a stoichiometric ratio of $(Ag_yCu_{2-y})_{1-x}Te_{1-z}Se_z$, wherein −0.025≤x≤0.075, 0.6≤y≤1.4, 0<z≤0.25, and then loading the Ag, Cu, Te and Se with ball-grinding balls into a ball-grinding tank, and then sealing in an argon atmosphere inside a glove box;

(S2) ball-grinding, which comprises: loading the ball-grinding tank into a high-energy ball mill machine, mechanically alloying for 10-20 h, and obtaining $(Ag_yCu_{2-y})_{1-x}Te_{1-z}Se_z$ powders; and (S3) sintering, which comprises: hot press sintering or spark plasma sintering the powders obtained by the step of (S2) with a graphite die at a temperature in a range of 200° C. to 500° C. for 3-10 min, and obtaining a $(Ag_yCu_{2-y})_{1-x}Te_{1-z}Se_z$ bulk thermoelectric material.

Further, in the step of (S1), x=−0.025, 0, 0.005, 0.01, or 0.075, y=0.6, 0.8, 0.9, 1, 1.2, or 1.4, z=0.05, 0.1, 0.12, 0.2, or 0.25.

Further, in the step of (S2), ball-grinding is performed for 15 h.

Further, in the step of (S3), the sintering is performed at 218° C. for 5 min.

First Embodiment (S1) Charging, which comprises: respectively weighing 2.9342 g of silver (Ag), 1.7282 g of copper (Cu), 3.1229 g of tellurium (Te), and 0.2147 g of selenium (Se) according to a stoichiometric ratio of $AgCuTe_{0.9}Se_{0.1}$, and then loading the Ag, Cu, Te and Se withball-grinding balls into a ball-grinding tank, and then sealing in an argon atmosphere inside a glove box;

(S2) Ball-grinding, which comprises: loading the ball-grinding tank into a high-energy ball mill machine, mechanically alloying for 15 h, and obtaining $AgCuTe_{0.9}Se_{0.1}$ powders; and (S3) Sintering, which comprises: hot press sintering the powders obtained by the step of (S2) with a graphite die at 218° C. for 5 min, and obtaining a $AgCuTe_{0.9}Se_{0.1}$ bulk thermoelectric material.

Second Embodiment (S1) Charging, which comprises: respectively weighing silver (Ag), copper (Cu), tellurium (Te), and selenium (Se) according to a stoichiometric ratio of $AgCuTe_{1-z}Se_z$, wherein z=0.05, 0.1, 0.12, 0.2, or 0.25 and a total amount of the Ag, Cu, Te and Se is 8 g, and then loading the Ag, Cu, Te and Se with ball-grinding balls into a ball-grinding tank, and then sealing in an argon atmosphere inside a glove box;

(S2) Ball-grinding, which comprises: loading the ball-grinding tank into a high-energy ball mill machine, mechanically alloying for 15 h, and obtaining $AgCuTe_{1-z}Se_z$ powders, wherein z=0.05, 0.1, 0.12, 0.2, or 0.25; and (S3) Sintering, which comprises: hot press sintering the powders obtained by the step of (S2) with a graphite die at 200° C. for 5 min, and obtaining a $AgCuTe_{1-z}Se_z$ bulk thermoelectric material, wherein z=0.05, 0.1, 0.12, 0.2, or 0.25.

Third Embodiment (S1) Charging, which comprises: respectively weighing silver (Ag), copper (Cu), tellurium (Te), and selenium (Se) according to a stoichiometric ratio of $Ag_yCu_{2-y}Te_{0.9}Se_{0.1}$, wherein y=0.6, 0.8, 0.9, 1, 1.2, or 1.4 and a total amount of the Ag, Cu, Te and Se is 8 g, and then loading the Ag, Cu, Te and Se with ball-grinding balls into a ball-grinding tank, and then sealing in an argon atmosphere inside a glove box;

(S2) Ball-grinding, which comprises: loading the ball-grinding tank into a high-energy ball mill machine, mechanically alloying for 15 h, and obtaining $Ag_yCu_{2-y}Te_{0.9}Se_{0.1}$ powders, wherein y=0.6, 0.8, 0.9, 1, 1.2, or 1.4; and (S3) Sintering, which comprises: hot press sintering the powders obtained by the step of (S2) with a graphite die at 200° C. for 5 min, and obtaining a $Ag_yCu_{2-y}Te_{0.9}Se_{0.1}$ bulk thermoelectric material, wherein y=0.6, 0.8, 0.9, 1, 1.2, or 1.4.

Fourth Embodiment (S1) Charging, which comprises: respectively weighing silver (Ag), copper (Cu), tellurium (Te), and selenium (Se) according to a stoichiometric ratio of $(AgCu)_{1-x}Te_{0.9}Se_{0.1}$, wherein x=−0.025, 0, 0.005, 0.01, or 0.075 and a total amount of the Ag, Cu, Te and Se is 8 g, and then loading the Ag, Cu, Te and Se with ball-grinding balls into a ball-grinding tank, and then sealing in an argon atmosphere inside a glove box;

(S2) Ball-grinding, which comprises: loading the ball-grinding tank into a high-energy ball mill machine, mechanically alloying for 15 h, and obtaining $(AgCu)_{1-x}Te_{0.9}Se_{0.1}$ powders, wherein x=−0.025, 0, 0.005, 0.01, or 0.075; and (S3) Sintering, which comprises: hot press sintering the powders obtained by the step of (S2) with a graphite die at 200° C. for 5 min, and obtaining a $(AgCu)_{1-x}Te_{0.9}Se_{0.1}$ bulk thermoelectric material, wherein x=−0.025, 0, 0.005, 0.01, or 0.075.

Fifth Embodiment (S1) Charging, which comprises: respectively weighing 2.9406 g of silver (Ag), 1.7146 g of copper (Cu), 3.1297 g of tellurium (Te), and 0.2152 g of selenium (Se) according to a stoichiometric ratio of $(AgCu)_{0.995}Te_{0.9}Se_{0.1}$, and then loading the Ag, Cu, Te and Se with ball-grinding balls into a ball-grinding tank, and then sealing in an argon atmosphere inside a glove box;

(S2) Ball-grinding, which comprises: loading the ball-grinding tank into a high-energy ball mill machine, mechanically alloying for 15 h, and obtaining $(AgCu)_{0.995}Te_{0.9}Se_{0.1}$ powders; and (S3) Sintering, which comprises: hot press sintering the powders obtained by the step of (S2) with a graphite die at 200° C. for 5 min, and obtaining a $(AgCu)_{0.995}Te_{0.9}Se_{0.1}$ bulk thermoelectric material.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, the present invention includes all modifications encompassed within the spirit and scope of the following claims.

What is claimed is:

1. A thermoelectric material, which possesses a chemical formula of $(Ag_yCu_{2-y})_{1-x}Te_{1-z}Se_z$, wherein: −0.025≤x≤0.075, 0.6≤y≤1.4, 0<z≤0.25, diffraction peaks of a main phase of the thermoelectric material are indexed as a cubic structure at room temperature of 300 K, a highest ZT (thermoelectric figure of merit) value between 300 K and 673 K is in a range of 0.4 to 1.6, an average ZT value is in a range of 0.2 to 1.4.

2. The thermoelectric material, as recited in claim 1, wherein: x=−0.025, 0, 0.005, 0.01, or 0.075; y=0.6, 0.8, 0.9, 1, 1.2, or 1.4; z=0.05, 0.1, 0.12, 0.2, or 0.25.

3. The thermoelectric material, as recited in claim 1, wherein: (x, y, z)=(0, 1, 0.1) or (0.005, 1, 0.1).

* * * * *